United States Patent [19]

Manduley et al.

[11] 4,034,287
[45] July 5, 1977

[54] GENERAL PURPOSE DIGITAL LOGIC MONITOR

[75] Inventors: Flavio M. Manduley, Seymour; Daniel F. Dlugos, Huntington, both of Conn.

[73] Assignee: Pitney-Bowes, Inc., Stamford, Conn.

[22] Filed: Dec. 15, 1975

[21] Appl. No.: 640,487

[52] U.S. Cl. .................... 324/73 R; 340/174 WA; 235/151.31
[51] Int. Cl.² ................. G01R 15/12; G11C 11/02
[58] Field of Search ........ 324/73 R, 73 AT, 73 PC, 324/158 T; 235/153 AC, 151.31; 340/174 WA; 315/377

[56] References Cited
UNITED STATES PATENTS

| | | | |
|---|---|---|---|
| 3,501,754 | 3/1970 | Davie | 340/174 WA |
| 3,641,519 | 2/1972 | Ashley | 340/174 RC |
| 3,646,438 | 2/1972 | Staff | 324/73 R |
| 3,870,953 | 3/1975 | Boatman et al. | 324/73 R |

*Primary Examiner*—Rudolph V. Rolinec
*Assistant Examiner*—Vincent J. Sunderdick
*Attorney, Agent, or Firm*—Robert S. Salzman; William D. Soltow, Jr.; Albert W. Scribner

[57] ABSTRACT

For servicing digital logic circuits, a hand-held monitor can be connected to an indefinite number of different sets of test points. Numerical and binary displays indicate the current state of the selected test points. To help the user understand what is being monitored, removable cards can be mounted adjacent the displays. Each of the cards has printed information relating to a different set of test points. An operator-controlled auxiliary clock is included to permit the operator to step the circuit being monitored through its operating sequence.

29 Claims, 5 Drawing Figures

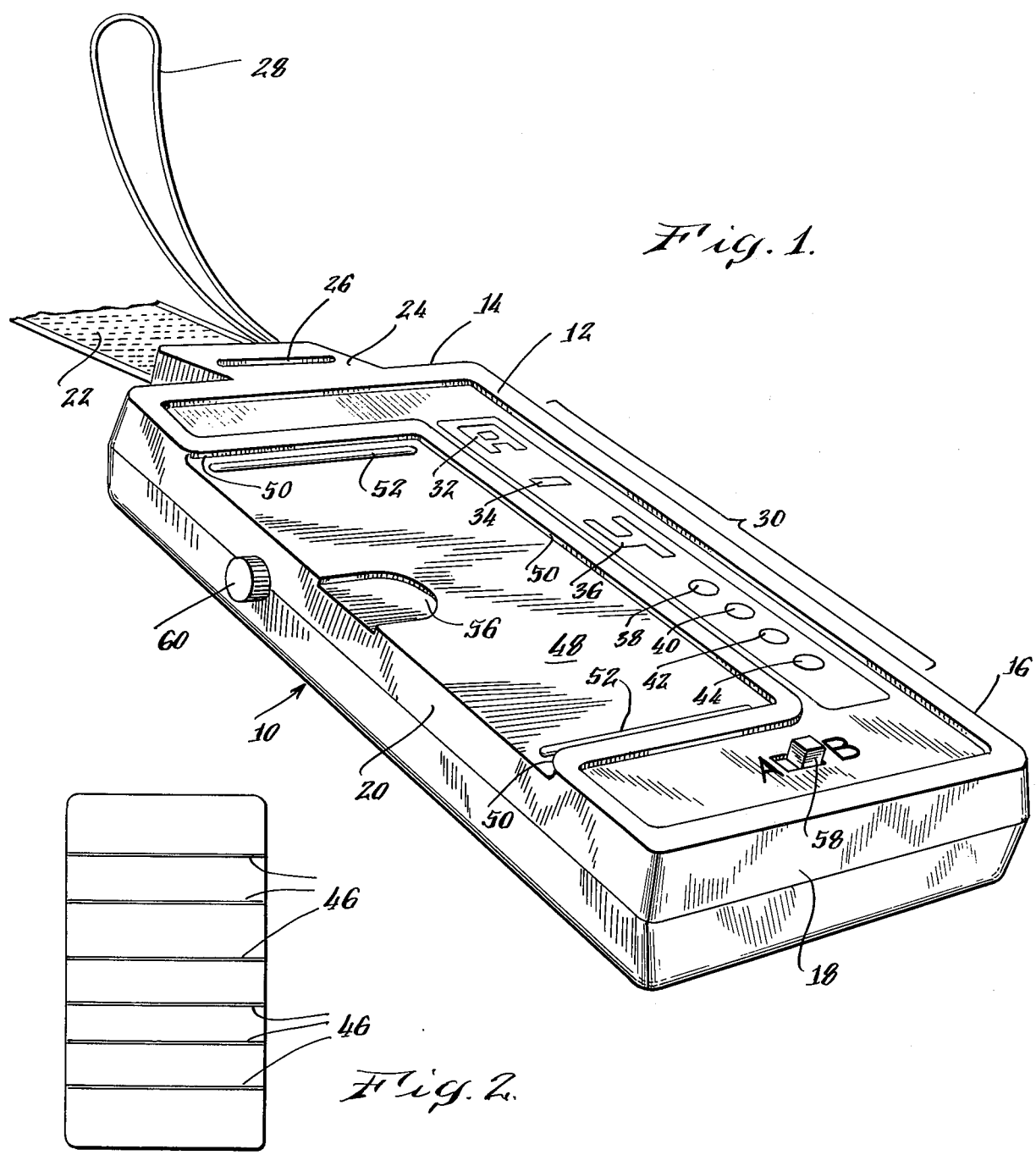
Fig. 1.
Fig. 2.
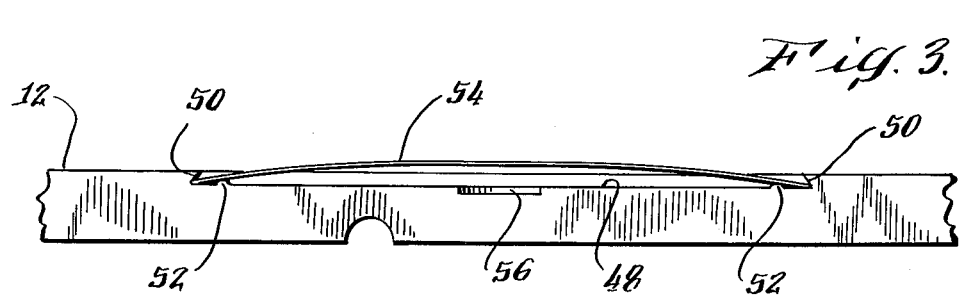
Fig. 3.

GENERAL PURPOSE DIGITAL LOGIC MONITOR

BACKGROUND OF THE INVENTION

The present invention relates to testing devices and more particularly to a general purpose digital logic monitor for use in servicing digital logic circuits.

A number of techniques have been developed for monitoring the operation of digital logic circuits in the course of servicing those circuits. The simplest technique is simply to check voltages one test point at a time to determine whether the binary value of each voltage is what it should be. Since digital information is often processed in parallel, the circuit being monitored may have to be cycled through its operating sequence a number of times for an operator to monitor all of the points required to establish the value of parallel-presented digital information. Consequently, the point-at-a-time technique is slow and inefficient.

In some types of apparatus, notably digital computers, a permanent display panel is built either into a control console for the device or into access doors to the digital electronics. Such permanent displays continually indicate the state of selected test points within the apparatus. While such permanent displays serve their limited purpose quite adequately, they obviously cannot be used to monitor any test points other than those to which they are permanently connected. Moreover, the cost of such displays is considerable since (1) new displays must be designed each time the associated apparatus is redesigned and (2) there must be a complete set of display components for each set of test points being monitored.

Portable or semi-portable monitors have been developed for use in monitoring specific test points within a specific apparatus. Such portable or semi-portable devices operate in basically the same way as built-in displays and are subject to the same drawbacks and limitations.

Portable monitors for testing integrated circuit packages are also known. Such monitors are useful only to persons who are extremely familiar with the configuration of the circuit being tested.

Prior art monitors of the type discussed above are generally passive devices. Passive monitors accept and display digital information at the normal operating rate of the circuit being monitored. Rapidly changing displays in such monitors make it difficult to isolate the digital information as it exists at particular steps in the operating sequence.

SUMMARY OF THE INVENTION

The present invention is a general purpose monitor which may be used in servicing an indefinite number of sets of test points in different types of logic circuits.

The monitor includes a support means and connectors for carrying digital signals from a plurality of test points to the support means. A visual display apparatus receives signals from the connector means to provide a visual display at one surface of the support means representing the current decimal or binary values of the test points being monitored. Means are included for retaining one of a number of removable cards on the surface of the support means adjacent the visual display. Each of the cards has printed information relating to a different set of test points in the circuit being serviced.

DESCRIPTION OF THE DRAWINGS

While the specification concludes with claims particularly pointing out distinctly claiming that which is regarded as the present invention, further details and advantages of a preferred embodiment of the invention may be more readily ascertained from the following detailed description when read in conjunction with the accompanying drawings wherein:

FIG. 1 is a perspective view of a general-purpose monitor constructed in accordance with the present invvention;

FIG. 2 is a top view of a representative, removable, card for use with the monitor illustrated in FIG. 1;

FIG. 3 is a partial view of the monitor, taken along lines 3—3 in FIG. 1, with a removable card in place;

DESCRIPTION OF SPECIFIC EMBODIMENTS

Figure 4:
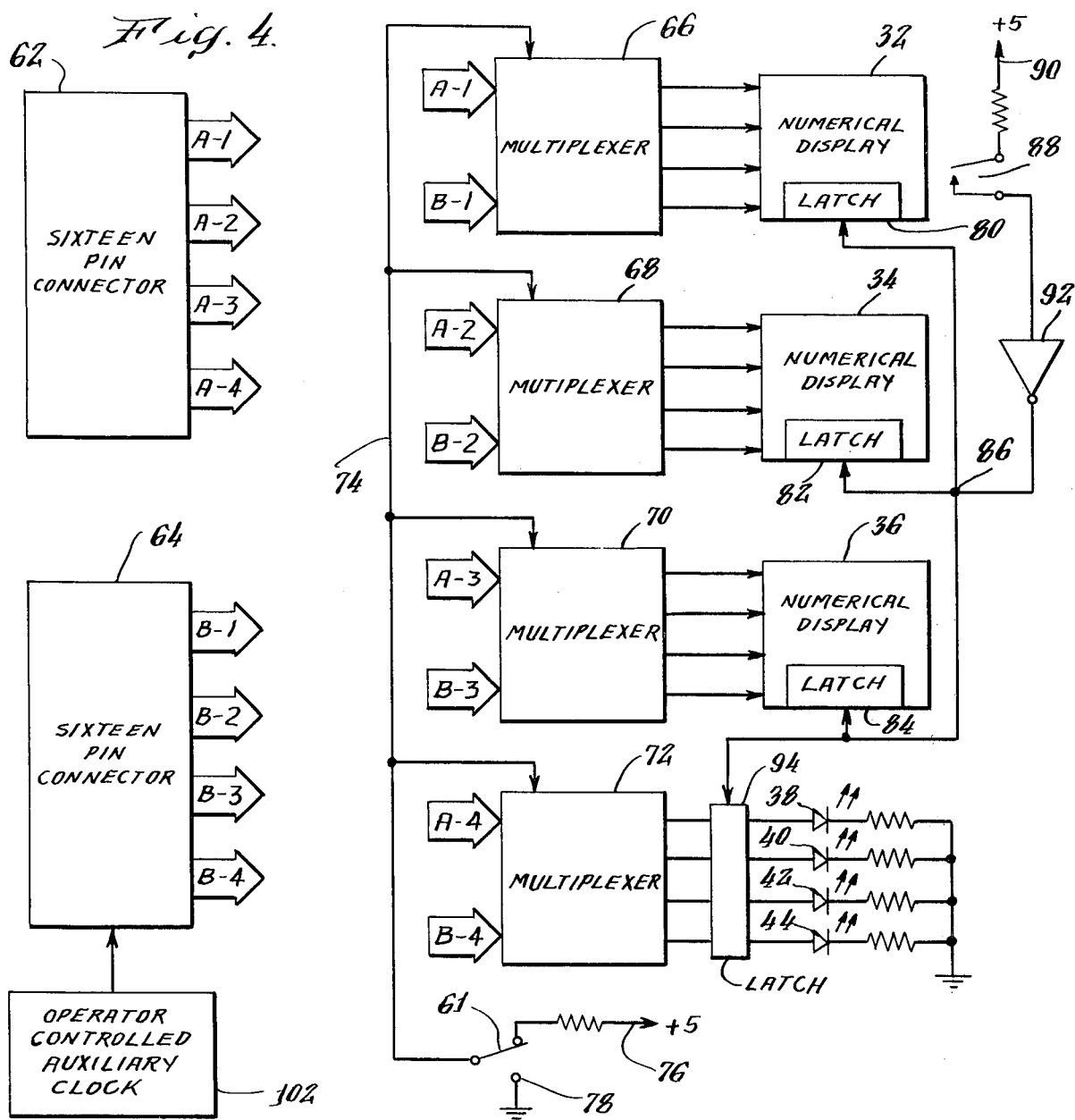
FIG. 4 is a schematic diagram of the internal circuitry of the monitor.

Referring to FIG. 1, a general purpose monitor constructed in accordance with the present invention includes a support means which is preferably an enclosure 10 having a top surface 12, a bottom surface which cannot be seen in the drawing, and sidewalls 14, 16, 18 and 20. The monitor can be connected to sets of test points in any circuit being serviced through a connector means including a ribbon cable 22 which passes through a neck 24 extending outwardly from side wall 14. The free end of ribbon cable 22 is preferably terminated in one or more multi-pin connector blocks which can be mated with complementary blocks of test points in the circuit being monitored. The enclosure 10 has top and bottom half sections which are preferably joined by fasteners, such as machine screws, extending through openings in the bottom half of the enclosure 10 into internally-threaded bosses within the top half. This type of construction is conventional and need not be illustrated. A strain relief for ribbon cable 22 is provided by an embossed trough 26 in neck 24. The ribbon cable 22 is clamped between the bottom half of enclosure 10 to prevent stresses on the ribbon cable 22 from being transmitted to cable connections within enclosure 10. A carrying strap 28 is connected to the enclosure 10 at the sidewall 14.

Numerical or binary values for test points being monitored are indicated at a visual display 30 at the top surface 12 of the enclosure 10. In a preferred embodiment, the visual display includes three-single digit, segmented, numerical display elements 32; 34 and 36, and four indicator lights 38; 40; 42 and 44, which indicate the binary value of individual test points. The indicator lights are preferably light-emitting diodes.

The numerical display element 32; 34 and 36 and indicator lights 38; 40; 42 and 44 clearly display the status of individual test points or sets of test points to which the ribbon cable 22 is electrically connected, but are of limited usefulness unless it is known which test points in the circuit being monitored are represented by a particular numerical or binary display. It would be difficult for an experienced technician, let alone an inexperienced technician, to keep this information in mind.

To greatly simplify the task of the technician, the monitor includes a retaining means for allowing removable printed cards to be retained on the top surface 12 adjacent the visual display 30. Referring briefly to FIG. 2, a representative card is shown. The card, which is preferably made of a laminated plastic, is divided by horizontal lines into a number of sections 46, each of which is aligned with one of the numerical display elements 32; 34 and 36, or one of the indicator lights 38; 40; 42 and 44. The information printed in each of the sections 46 identifies the test point or points to which the adjacent display element is electrically connected.

To use the monitor, a technician determines which block of test points is to be connected to the monitor through ribbon cable 22 and selects the printed car having information relating to the selected test points. The selected card is inserted into the retaining means (described in more detail below) on the top surface 12 of the enclosure 10 to permit the technician to readily identify the data being displayed at each indicator.

Referring back to FIG. 1, the removable cards are retained in a shallow recess 48 in the top surface 12. The recess 48 has the same general length and width as each of the removable cards and includes undercut edges 50 on three sides. The fourth side of the recess 48 extends to the side wall 20 to allow a card to be slipped into position from the side of the enclosure 10. The floor of recess 48 includes protruding ridges 52 which generally parallel the end walls of the recess 48.

Referring to FIG. 3, which is a partial view of sidewall 20 in the area of recess 48, the ridges 52 serve to slightly flex an inserted card 54. This results in bringing the ends of that card into contact with the undercut portion of the walls 50 of the recess 48. The amount of flexure shown is exaggerated.

To make it easier for an operator to remove an inserted card, a small undercut 56 is formed in the floor of recess 48 at side wall 20. The undercut 56 simply provides room for an operator to insert the tip of his finger under an inserted card, so that he can grip the top and the bottom surface of the card 54 to remove it from recess 48.

In a preferred embodiment, incoming data is multiplexed. That is, the visual display 30 represents the values of signals in one of at least two groups of test points connected to ribbon cable 22 at the same time. The technician selects the group to be displayed by means of a slider switch 58. The circuitry for performing the multiplexing function is described in more detail later.

A pushbutton 60 protruding from the side wall 20 of the enclosure is part of a technician-controlled auxiliary clock. This auxiliary clock, described in more detail hereinafter, permits the technician to generate single clock pulses which, when applied to the circuit being monitored, cause the circuit to step through its predetermined series of operations at a rate controlled by the technician.

Referring to FIG. 4, the free end of the ribbon cable 22 is terminated in a first 16 pin connector block 62 and a second 16 pin connector block 64. The number of connector blocks or the number of pins per connector block is a matter of design. The number of pins can be increased or decreased provided corresponding changes are made in the associated logic circuitry.

For ease of illustration, each 16 pin connector block is shown as having 4 outputs. The outputs from connector block 62 are A-1, A-2, A-3 and A-4. Corresponding outputs from the connector block 64 are B-1, B-2, B-3 and B-4. Each of the A outputs and each of the B outputs is a four lead array carrying binary data, which may be decoded to drive a 0-9 numeric display element. It should be noted with a fourbit output that the display can also driven to depict six other lettered values or symbols; e.g., A.C.E.F.J.P.S. (16 bits). The A-1 output and the B-1 output are applied to a multiplexer 66. The outputs A-2 and B-2 are applied to a similar multiplexer 68. Outputs A-3 and B-3 are applied to another multiplexer 70, while outputs A-4 and B-4 are applied to fourth multiplexer 72.

The multiplexers may be conventional in nature. One example of a commecially available multiplexer which may be used, is a Signetics N74 157 Quadruple 2-line to 1-line Data Selector-Multiplexer available from Sig-netics Corporation, Menlo Park, California, and described in detail at Page 2–150 in the Signetics 1974 Data Book.

Such multiplexers select a four-bit word from one of two sources, and route it to four parallel multiplexer outputs. The selection of the four-bit word to be transmitted to the output, is under the control of a binary select signal which is provided over lead 74. Lead 74 is connected to a switch 61 actuated by the button 58, shown in FIG. 1. Depending on the position of the switch 61, lead 74 is connected either to a logic voltage source 76 (binary 1), or to a ground terminal 78 (binary 0), to provide the necessary select signals.

Figure 5:
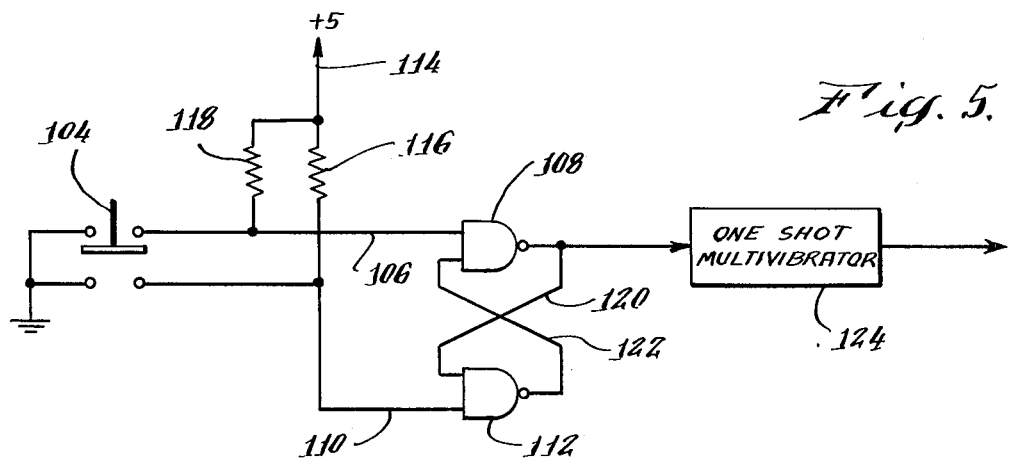
FIG. 5 is a schematic diagram of an operator-controlled auxiliary clock.

The selected inputs to multiplexers 66, 68 and 70 are transmitted to lettered or numerical display modules 32, 34 and 36 respectively (FIGS. 1 and 5). Each module accepts a four bit input from the associated multiplexer, decodes that input to determine which of the lettered or numeric characters (0–9)is to be displayed, and provides the necessary driving signals for the display. Each of the display logic modules 32, 34 and 36 may be conventional in nature. One commerically available module is the TIL308 Numeric Display package available from Texas Instruments Corp.

In a preferred embodiment of the invention, the lettered or numerical display may be frozen by means of a strobe latch signal applied over a lead 86 to the display modules 32, 34 and 36. The display modules 32, 34 and 36, respectively, have built-in latches 80, 82, and 84 to freeze the input. The strobe latch signal is generated by means of a normally closed switch 88 which connects a logic voltage source 90 to an input of an inverter 92. When an operator wishes to freeze the lettered or numerical display, the switch 88 is opened, causing a binary 1 signal to be applied to the modules 32, 34 and 36. The operation of the circuit being monitored will continue without interruption, since the freezing of the display in no way affects the circuit being monitored.

The four parallel outputs of the fourth multiplexer 72 are applied in parallel to the light emitting diodes 38, 40, 42 and 44 (FIGS. 1 and 5). These light emitting diodes provide a visual indication whether the input signal to the diode is a binary one or binary zero. A latch 94, having four pin connections, is connected across the LED's, and receives a strobe latch signal from lead 86. Thus, the LED's are also frozen.

Since most digital logic circuits operate at speeds which makes it difficult to observe the status of selected points within the circuit at a given time, an operator-controlled auxiliary clock 102 is included in the hand-held monitor. This auxiliary clock is described in more detail with reference to FIG. 5.

Now referring to FIG. 5, a two position switch 104 has an up position in which the switch grounds one input 106 to a NAND gate 108, and a down position in which the switch grounds one input 110 to a second NAND 112. When the switch 104 is in its up position, input 110 is connected to a logic voltage source 114 through a first resistor 116. When the switch 104 is in its down position, the input 106 to NAND gate 108 is connected to the logic voltage source 114 through a second resistor 118. The NAND gates 108 and 112 are cross-coupled. That is, the output of NAND gate 108 is applied to the second input of NAND gate 112 through lead 120, while the output of NAND gate 112 is coupled to the second input of NAND gate 108 through lead 122.

The cross-coupled NAND gates 108 and 112 constitute a pulse-shaping circuit, which provides a suitable negative-going trigger pulse to a one-shot multivibrator 124, each time the switch 104 is momentarily depressed. The output of the one-shot multivibrator 124 provides a pulse having the same amplitude as the regular clock pulses generated within the circuit being monitored. This output is applied, preferably through ribbon cable 22, to an auxiliary clock input terminal in the circuit being monitored.

While there has been described what is considered to be a preferred embodiment of the present invention, variations and modifications will occur to those skilled in the art once they become familiar with the invention. Therefore, it is intended that the appended claims shall be construed to include all such variations and modifications as fall within the true spirit and scope of the invention.

What is claimed is:

1. A general purpose electronic monitor for use in servicing digital logic circuits within a system having a clock, comprising
    a display for providing a visual read-out of the status of a digital logic circuit;
    connection means adapted to be connected to a selected digital logic circuit for carrying digital signals between the selected circuit and said display;
    an auxiliary clock for permitting an operator to introduce clock pulses to the selected digital logic circuit to step the circuit through its operating sequence at an operator-selected rate as an alternative to having the circuit driven by the system clock; and
    means for latching said display to permit an operator to freeze inputted signals on the display without interrupting continued digital logic circuit operation.

2. The general purpose electronic monitor of claim 1, wherein said display includes means for displaying a numerical value of at least a portion of a set of digital signals.

3. The general purpose electronic monitor of claim 2, further including multiplexing means operatively interconnected between said connection means and said numerical value display means for providing an expanded displaying capability for said numeric value display means.

4. The general purpose electronic monitor of claim 1, wherein said display includes means for displaying a lettered value of at least a portion of a set of digital signals.

5. The general purpose electronic monitor of claim 4, further including multiplexing means operatively interconnected between said connection means and said lettered value display means for providing an expanded displaying capability for said lettered value display means.

6. The general purpose electronic monitor of claim 1, wherein said display includes means for displaying binary values of at least a portion of a set of digital signals.

7. The general purpose electronic monitor of claim 6, wherein said means for displaying binary values comprises at least one light emitting diode.

8. The general purpose electronic monitor of claim 6, including multiplexing means operatively interconnected between said connection means and said binary value display means for providing an expanded displaying capability for said binary value display means.

9. The general purpose electronic monitor of claim 1, wherein said display includes means for displaying a symbol for at least a portion of a set of digital signals.

10. The general purpose electronic monitor of claim 9, including multiplexing means operatively interconnected between said connection means and said symbol displaying means for providing an expanded displaying capability for said symbol displaying means.

11. The general purpose electronic monitor of claim 1, further including information means associated with, and supported adjacent, said display for aiding in the understanding of displayed values.

12. The general purpose electronic monitor of claim 11, wherein said information means is removably supported adjacent said display, and further wherein each circuit being monitored required its own individual information means.

13. A general purpose electronic monitor for use in servicing digital logic circuits within a system having a clock comprising:
    a display for providing a visual read-out of the status of a digital logic circuit;
    connection means adapted to be connected to a selected digital logic circuit for carrying digital signals between the selected circuit and said display;
    multiplexing means interposed between said display and said connection means for permitting more than one set of test points within the digital logic system to be monitored with a single connection;
    an auxiliary clock for permitting an operator to introduce clock pulses to the selected digital logic circuit to step the circuit through its operating sequence at an operator-selected rate as an alternative to having the circuit driven by the system clock; and
    means for latching said display to permit an operator to freeze inputted signals on the display without interrupting continued digital logic circuit operation.

14. The general purpose electronic monitor of claim 13, wherein said display includes means for displaying a numerical value of at least a portion of a set of digital signals.

15. The general purpose electronic monitor of claim 13, wherein said display includes means for displaying a lettered value of at least a portion of a set of digital signals.

16. The general purpose electronic monitor of claim 13, wherein said display includes means for displaying binary values of at least a portion of a set of digital signals.

17. The general purpose electronic monitor of claim 16, wherein said means for displaying binary values comprises at least one light emitting diode.

18. The general purpose electronic monitor of claim 13, wherein said display includes means for displaying a symbol for at least a portion of a set of digital signals.

19. The general purpose electronic monitor of claim 18, including multiplexing means operatively interconnected between said connection means and said symbol displaying means for providing an expanded displaying capability for said symbol displaying means.

20. The general purpose electronic monitor of claim 13, further including information means associated with, and supported adjacent, said display for aiding in the understanding of displayed values.

21. The general purpose electronic monitor of claim 20, wherein said information means is removably supported adjacent said display, and further wherein each circuit being monitored requires its own individual information means.

22. A general purpose monitor apparatus for use in servicing digital logic circuits, comprising:
 a. support means comprising a housing having a top surface, a bottom surface and sidewalls connecting said surfaces to form an enclosure;
 b. connector means for carrying digital signals from a plurality of test points of a digital logic circuit being serviced;
 c. display means connected to said connector means and carried by said housing at the top surface thereof, said display means providing a visual display of the status of test points being monitored; and
 d. means at the top surface of said housing for retaining one of a plurality of removable cards adjacent the display means, each of said cards having printed information relating to a visual display of the status of a unique set of test points in the circuit being serviced.

23. The general purpose monitor apparatus recited in claim 22, wherein said display means includes means for displaying a numerical value of at least a portion of a set of test points.

24. The general purpose monitor apparatus of claim 22, wherein said display means includes means for displaying a lettered value of at least a portion of a set of test points.

25. The general purpose monitor apparatus of claim 22, wherein said display means includes means for displaying a symbol for at least a portion of a set of test points.

26. The general purpose monitor recited in claim 22, wherein said display means further includes light-emitting means for displaying the binary value of selected test points.

27. The general purpose monitor apparatus recited in claim 22, wherein said card retaining means further comprises:
 a. a recessed area on the top surface of said enclosure having generally the same surface dimensions as one of the removable cards, and slightly undercut walls for retaining the edges of an inserted card; and
 b. at least one protrusion extending from the recessed area for slightly flexing an inserted card.

28. The general purpose monitor apparatus recited in claim 27, wherein said recessed area extends to one side wall of said enclosure, allowing an operator to slide the removable cards into and out of a retained position.

29. The general purpose monitor apparatus recited in claim 28, further including a small, relatively deeper recess at one edge of the card recess for permitting an operator to easily grasp the bottom surface of a removable card when starting to remove that card.

* * * * *